United States Patent
Bae et al.

(10) Patent No.: US 7,759,807 B2
(45) Date of Patent: Jul. 20, 2010

(54) SEMICONDUCTOR PACKAGE HAVING STRUCTURE FOR WARPAGE PREVENTION

(75) Inventors: Han Jun Bae, Kyoungki-do (KR); Jae Myun Kim, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 435 days.

(21) Appl. No.: 11/754,492

(22) Filed: May 29, 2007

(65) Prior Publication Data

US 2008/0116563 A1   May 22, 2008

(30) Foreign Application Priority Data

Nov. 21, 2006   (KR) .................... 10-2006-0114932
Dec. 29, 2006   (KR) .................... 10-2006-0138467

(51) Int. Cl.
*H01L 23/29*   (2006.01)
*H01L 21/50*   (2006.01)

(52) U.S. Cl. ...................... 257/790; 438/127

(58) Field of Classification Search ............... 257/687, 257/697, 787–790, E23.011–E23.067; 438/124–127
See application file for complete search history.

(56) References Cited

U.S. PATENT DOCUMENTS

| 6,870,274 B2 * | 3/2005 | Huang ..................... 257/780 |
| 7,298,035 B2 * | 11/2007 | Hosokawa et al. ........... 257/686 |
| 2005/0062155 A1 | 3/2005 | Tsai |
| 2005/0077080 A1 | 4/2005 | Dairo et al. |

FOREIGN PATENT DOCUMENTS

| JP | 10-022422 A | 1/1998 |
| KR | 1020020050556 A | 6/2002 |

* cited by examiner

*Primary Examiner*—Calvin Lee
(74) *Attorney, Agent, or Firm*—Ladas & Parry LLP

(57) ABSTRACT

A semiconductor package includes a substrate having a plurality of connection pads and a plurality of ball lands; a semiconductor chip attached to one surface of the substrate and having a plurality of bonding pads that are connected to the respective connection pads of the substrate; a first molding structure covering an upper surface of the substrate including a connection region between the bonding pads and the connection pads and the semiconductor chip; a second molding structure formed adjacent to an edge of the lower surface of the substrate; and a plurality of solder balls attached to the respective ball lands of the substrate.

19 Claims, 6 Drawing Sheets

SEMICONDUCTOR PACKAGE HAVING STRUCTURE FOR WARPAGE PREVENTION

CROSS-REFERENCE TO RELATED APPLICATIONS

The present application claims priority to Korean patent application numbers 10-2006-0114932 and 10-2006-0138467 filed on Nov. 21 and Dec. 29, 2006, respectively, which are incorporated herein by reference in their entirety.

BACKGROUND OF THE INVENTION

The present invention relates to a semiconductor package, and more particularly to a semiconductor package with a novel structure that prevents or reduces occurrence of warpage and solder ball defects due to thermal stress.

As is well known in the art, various techniques have been developed which allow the miniaturization, light-weight, high-speed operation and multi-functionality of electronic appliances. Semiconductor packages have thus been developed with the aim of reducing size and improving electrical characteristics. The ball grid array (BGA) package is a typical example.

The configuration of a conventional BGA package is as described below.

A semiconductor chip is attached to a substrate having circuit patterns. The bonding pads of the semiconductor chip and the electrode pads of the substrate are connected to each other by conductive bonding wires. A molding structure is formed on the upper surface of the substrate including the semiconductor chip and the bonding wires to protect the semiconductor chip and the bonding wires from external circumstances. Solder balls serving as mounting members for electrically connecting external circuits and the semiconductor chip to each other are formed on the lower surface of the substrate.

Since the BGA package has an overall size that is similar to the size of the semiconductor chip, the size of the mounting area is decreased. Further, because the BGA package is electrically connected to the external circuits through the solder balls, the minimization of electrical signal transmission paths improves the electrical characteristics.

However, in the conventional BGA package, since the molding structure is formed only on the upper surface of the substrate including the semiconductor chip and the bonding wires, the difference between the thermal expansion coefficients of the molding structure and the substrate causes warpage when heat is applied in subsequent processes and tests.

The warpage causes cracks in the connection portions of the solder balls and causes solder balls defects.

SUMMARY OF THE INVENTION

An embodiment of the present invention is directed to a semiconductor package which decreases the difference between the thermal expansion coefficients of a molding structure and a substrate, thereby minimizing the occurrence of warpage due to thermal stress.

Another embodiment of the present invention is directed to a semiconductor package which prevents solder ball defects by suppressing the occurrence of warpage.

In one embodiment, a semiconductor package comprises a substrate having a plurality of connection pads and a plurality of ball lands; a semiconductor chip attached to one surface of the substrate and having a plurality of bonding pads connected to the respective connection pads of the substrate; a first molding structure covering the upper surface of the substrate including the connection region between the bonding pads and the connection pads and the semiconductor chip; a second molding structure formed adjacent to the edge of the lower surface of the substrate; and a plurality of solder balls attached to the respective ball lands of the substrate.

The semiconductor chip is attached to the substrate in a face-down type.

The bonding pads are arranged in the middle portion on the surface of the semiconductor chip that faces the substrate.

The substrate has an opening at the middle portion thereof, which exposes the bonding pads of the semiconductor chip.

The connection pads are positioned around the opening on the other surface of the substrate, and the ball lands are positioned outward from the connection pads on the other surface of the substrate.

The connection pads of the substrate are electrically connected to the bonding pads of the semiconductor chip by metal wires which extend through the opening.

The opening of the substrate including the metal wires and a portion around the opening are filled and covered by the first molding structure.

The second molding structure extends from portions adjacent to ball lands, which are positioned at the outermost edge of the substrate.

The second molding structure is formed to have a height that is less than that of the solder ball.

In another embodiment, a semiconductor package comprises a substrate having a plurality of connection pads and a plurality of ball lands and defined with a plurality of via-holes adjacent to an edge thereof; a semiconductor chip attached to one surface of the substrate and having a plurality of bonding pads that are connected to the respective connection pads of the substrate; a first molding structure covering an upper surface of the substrate including a connection region between the bonding pads and the connection pads and the semiconductor chip; a second molding structure formed adjacent to the edge of the lower surface of the substrate; a third molding structure formed in the respective via-holes of the substrate; and a plurality solder balls attached to the respective ball lands of the substrate, wherein the first and second molding structures are integrally connected to each other by the third molding structure.

The via-holes are adjacent to the two opposite edge portions or all four edge portions of the substrate, on which the second molding structure is formed.

The semiconductor chip is attached to the substrate in a face-down manner.

The bonding pads are arranged in the middle portion on the surface of the semiconductor chip which faces the substrate.

The substrate has an opening in the middle portion thereof, which exposes the bonding pads of the semiconductor chip.

The connection pads are positioned around the opening on the other surface of the substrate, and the ball lands are positioned outward from the connection pads on the other surface of the substrate.

The connection pads of the substrate are electrically connected to the bonding pads of the semiconductor chip by metal wires that extend through the opening.

The opening of the substrate including the metal wires and a portion around the opening are filled and covered by the first molding structure.

The second molding structure is formed to extend from portions adjacent to the ball lands, which are positioned at the outermost edge of the substrate.

The second molding structure is formed to have a height that is less than that of the solder ball.

DESCRIPTION OF SPECIFIC EMBODIMENTS

In the present invention, by forming a molding structure adjacent to the outer edge of the lower surface of a substrate, it is possible to prevent a semiconductor package from being warped due to thermal stress.

Also, the present invention uses a substrate with a plurality of via-holes adjacent to two opposite edge portions or all four edge portions thereof. Since a molding structure is also formed in the via-holes, upper and lower molding structures may be connected to each other, by which it is possible to further prevent warpage of the semiconductor package due to thermal stress.

Accordingly, in the present invention, by preventing warpage of the semiconductor package, it is possible to prevent cracks from occurring in bonding portions between solder balls and ball lands, thereby improving the reliability of the semiconductor package.

Hereafter, a semiconductor package in accordance with an embodiment of the present invention will be described in detail.

Figure 1:
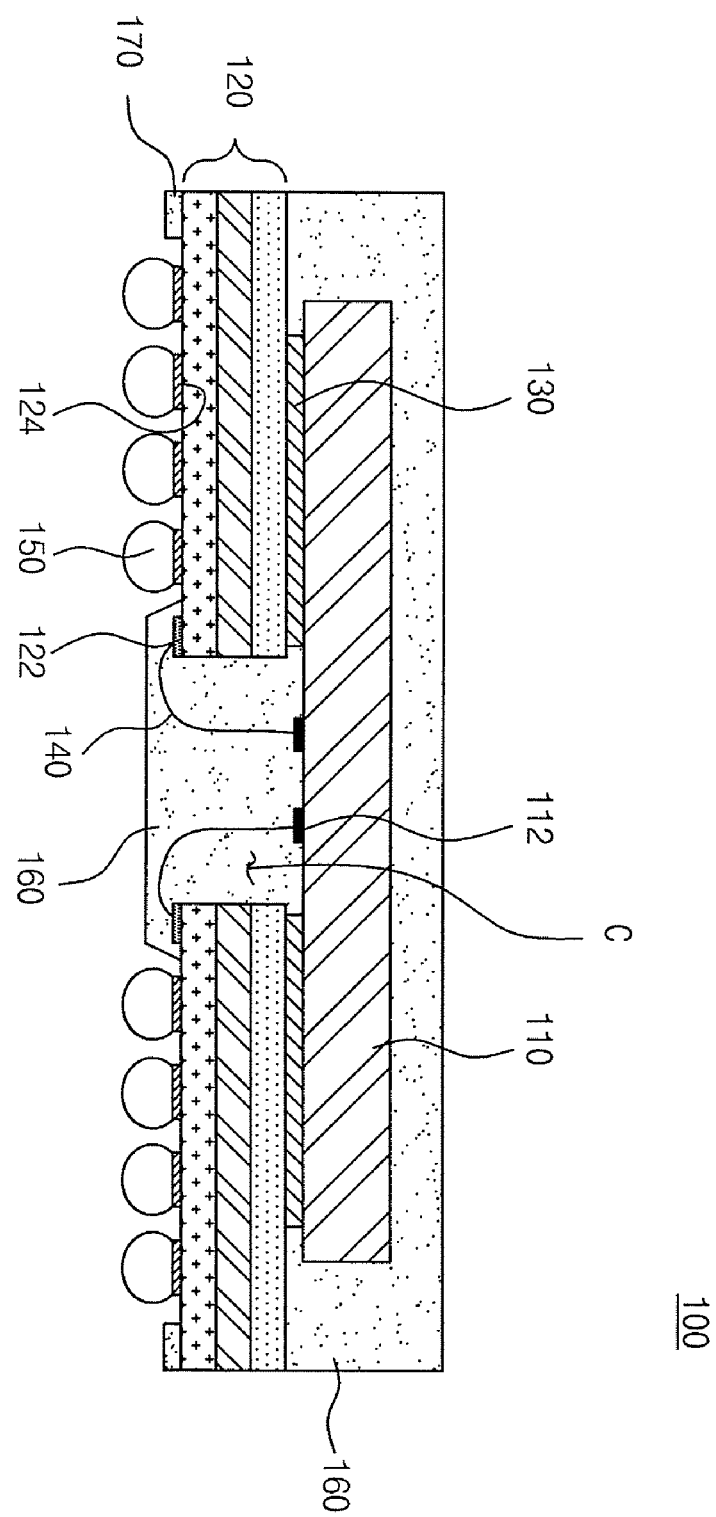
FIG. 1 is a cross-sectional view illustrating a semiconductor package in accordance with an embodiment of the present invention.

FIG. 1 is a cross-sectional view illustrating a semiconductor package in accordance with an embodiment of the present invention.

Referring to FIG. 1, a semiconductor package 100 includes a semiconductor chip 110, a substrate 120, a bonding material 130, bonding wires 140, solder balls 150, a first molding structure 160, and a second molding structure 170.

The semiconductor chip 110 has a plurality of bonding pads 112 on an active surface thereof, that is, on the surface thereof which faces the substrate 120 when it is mounted. The bonding pads 112 are formed in the middle portion of the active surface of the semiconductor chip 110. The semiconductor chip 110 is attached to the substrate 120 in a face-down manner.

The substrate 120 includes a plurality of connection pads 122 which are electrically connected to the bonding pads 112 of the semiconductor chip 110, a plurality of ball lands 124 which are electrically connected to the connection pads 122, and metal lines (not shown) which connect the connection pads 122 and the ball lands 124 to each other.

In a state in which the semiconductor chip 110 is mounted to the upper surface of the substrate 120 by the bonding material 130, the substrate 120 has, at the middle portion thereof, an opening C which has the shape of a slit and exposes the bonding pads 112.

The connection pads 122 and the ball lands 124 of the substrate 120 are formed on the lower surface of the substrate 120, that is, on the surface facing away from the upper surface to which the semiconductor chip 110 is attached. The connection pads 122 are positioned on both sides of the opening C on the lower surface of the substrate 120, and the ball lands 124 are positioned between the connection pads 122 and the edge portions of the substrate 120.

The bonding wires 140 electrically connect the bonding pads 112 of the semiconductor chip 110 and the connection pads 122 of the substrate 120 to each other. Preferably, the first ends of the bonding wires 140 are joined to the respective bonding pads 112, which are positioned on the lower surface of the semiconductor chip 110, and the second ends of the bonding wires 140 pass through the opening C and are joined to the connection pads 122, which are positioned on the lower surface of the substrate 120.

The first molding structure 160 is formed such that it covers the entire upper surface of the substrate 120, which includes the semiconductor chip 110, and a portion of the lower surface of the substrate 120, which includes the opening C and the connection pads 122. The first molding structure 160 functions to protect the semiconductor chip 110, the bonding wires 140, and the connections of the bonding wires 140 to the bonding pads 112 and the connection pads 122.

The second molding structure 170 is formed on the lower surface of the substrate 120. The second molding structure 170 functions to prevent the substrate 120 and the first molding structure 160 from being warped in a certain direction due to the difference between the thermal expansion coefficients of the first molding structure 160 and the substrate 120. The second molding structure 170 is formed along the edge portions along the lower surface of the substrate 120. In detail, the second molding structure 170 extends from the positions on the substrate 120 adjacent to the outermost ball lands toward the edge portions of the substrate 120, in a manner such that it forms a closed loop. The second molding structure 170 has a height less than that of the solder ball 150, and the ball lands 124 are located inside the second molding structure 170.

The first and second molding structures 160 and 170 are simultaneously formed using an epoxy molding compound (EMC) during a molding process.

The solder balls 150 are attached to the respective ball lands 124, which are positioned on the lower surface of the substrate 120 and serve as external connection terminals of the semiconductor chip 110.

Hereafter, a procedure for manufacturing the semiconductor package in accordance with an embodiment of the present invention will be described.

FIGS. 2A through 2D are cross-sectional views illustrating the process steps of a method for manufacturing the semiconductor package in accordance with an embodiment of the present invention.

Figure 2A:
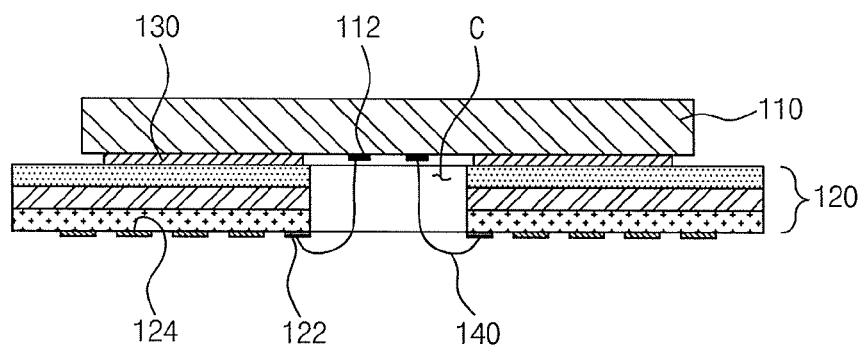
FIGS. 2A through 2D are cross-sectional views illustrating process steps of a method for manufacturing the semiconductor package in accordance with an embodiment of the present invention.

Referring to FIG. 2A, the semiconductor chip 110 having the plurality of bonding pads 112 at the middle portion thereof is attached to the upper surface of the substrate 120 by the medium of the bonding material 130 such that the lower surface of the semiconductor chip 110 faces the upper surface of the substrate 120. At this time, the bonding pads 112, which are positioned on the lower surface of the semiconductor chip 110, are exposed through the opening C defined in the shape of a slit.

The bonding wires 140 made of a conductive material electrically connect the bonding pads 112 of the semiconductor chip 110 and the connection pads 122 of the substrate 120 to each other.

Figure 2B:
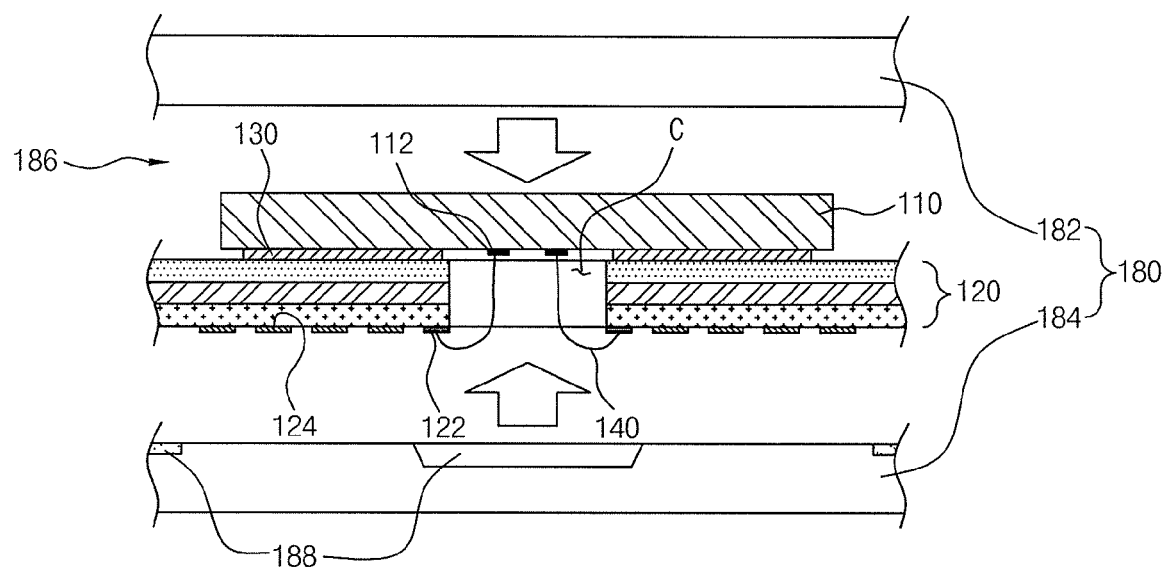

Referring to FIG. 2B, the substrate 120 having the semiconductor chip 110 mounted thereon is introduced into a molding unit 180, which is comprised of an upper mold die 182 and a lower mold die 184, such that it is positioned in a first cavity 186 defined between the upper and lower mold dies 182 and 184 of the molding unit 180. The lower mold die 184 has second cavities 188, which have sectional shapes respectively corresponding to those of the molding structures to be formed on the lower surface of the substrate 120. The molding structures will thereby cover the portion including the slit-shaped opening C and prevent the semiconductor package from being warped.

Figure 2C:
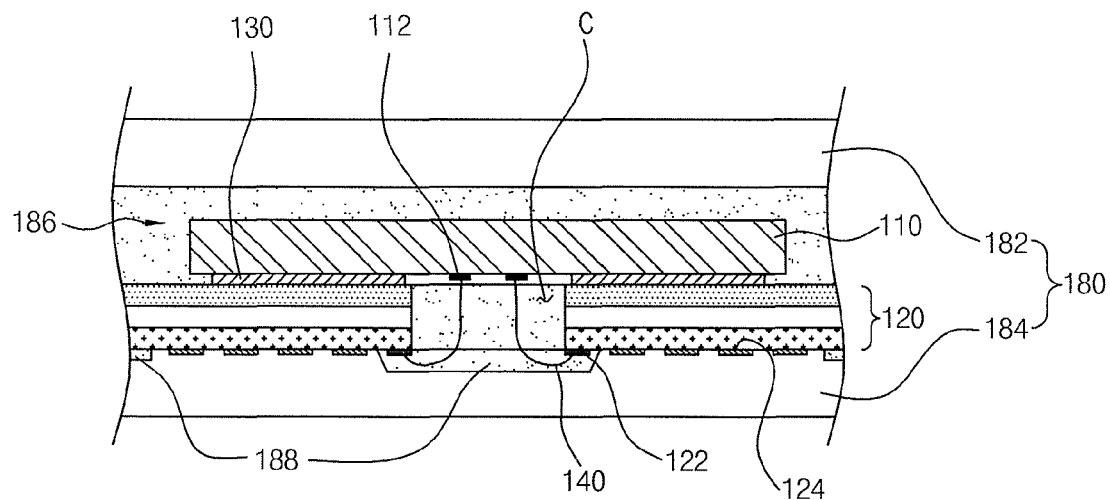

Referring to FIG. 2C, the upper mold die 182 and the lower mold die 184 are held at positions for forming the molding structures.

By actuating a heater (not shown) disposed in the lower mold die 184, molding resin of a solid state, for example, the epoxy molding compound is melted into a liquid state. The liquid state epoxy molding compound is injected into the first and second cavities 186 and 188 under a predetermined pressure such that the first and second cavities 186 and 188 are filled with the epoxy molding compound.

The liquid state epoxy molding compound is baked at a high temperature for a predetermined time. The first molding structure 160 is formed to cover the entire upper surface of the substrate 120, which includes the semiconductor chip 110, and a portion of the lower surface of the substrate 120, which includes the opening C and the connection pads 122. The second molding structure 170 is formed along the edge portions of the lower surface of the substrate 120 in such a way so as to form a closed loop.

Figure 2D:
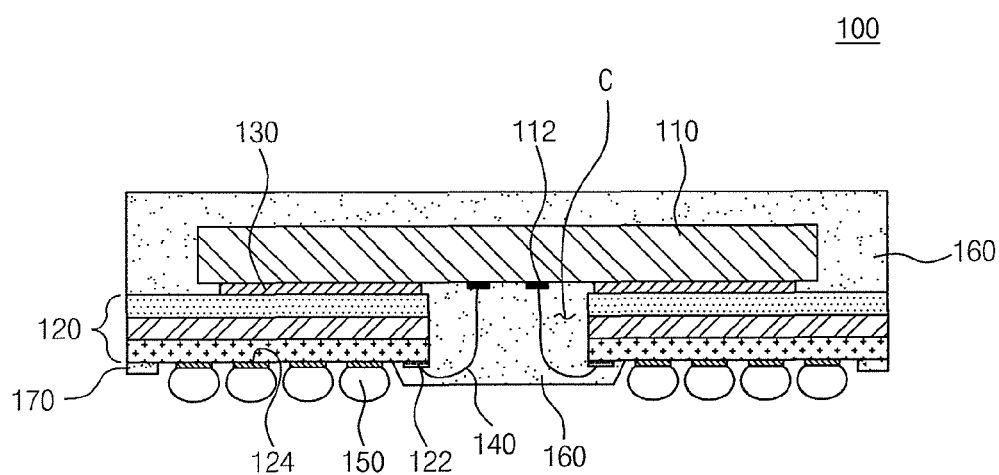

Referring to FIG. 2D, the solder balls 150 are attached to the respective ball lands 124 positioned on the lower surface of the substrate 120. The solder balls 150 serving as external connection terminals are formed on the ball lands 124 through a reflow process of melting a solder under high temperature.

The semiconductor package according to the present invention is manufactured by mounting a plurality of semiconductor chips on a strip substrate that has a plurality of unit substrates, on each of which at least one semiconductor chip is mounted.

Figure 3:
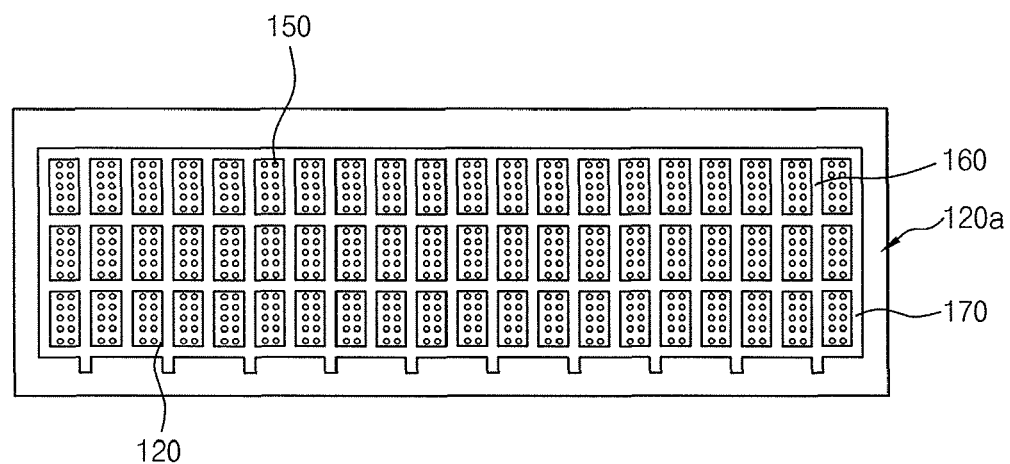
FIG. 3 is a plan view illustrating a state in which a plurality of semiconductor packages in accordance with an embodiment of the present invention are formed on a strip substrate.
Figure 4:
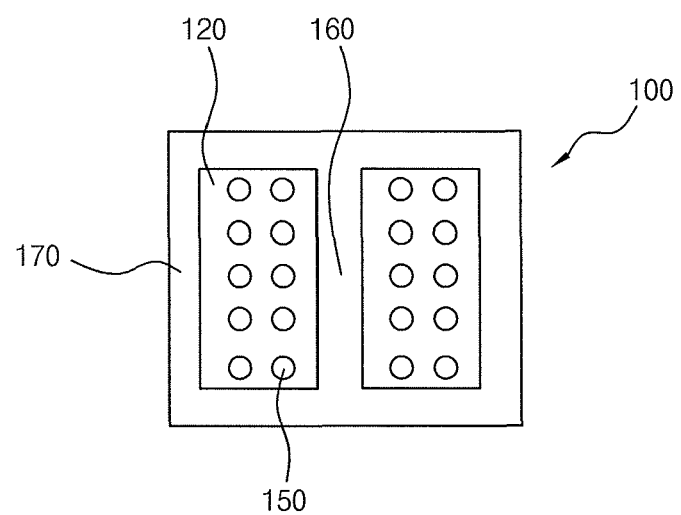
FIG. 4 is a plan view illustrating the semiconductor package in accordance with an embodiment of the present invention.

FIG. 3 is a plan view illustrating a state in which a plurality of semiconductor packages in accordance with an embodiment of the present invention are formed on a strip substrate, and FIG. 4 is a plan view illustrating the semiconductor package in accordance with an embodiment of the present invention.

Referring to FIGS. 3 and 4, semiconductor packages 100, manufactured as described above in accordance with an embodiment of the present invention, are simultaneously formed on a strip substrate 120a, which is composed of a plurality of unit substrates 120, each including the opening, the connection pads and the ball lands.

Referring to FIG. 4, the plurality of semiconductor packages 100, which are formed on the strip substrate 120a, are cut and separated into individual semiconductor packages.

In FIGS. 3 and 4, the reference numeral 150 designates solder balls; 160 designates a first molding structure; and 170 designates a second molding structure.

In an embodiment of the present invention, because the molding structure is formed adjacent to the edge portions on the lower surface of the substrate, when subsequently implementing processes such as a reflow process and a testing process after completion of the molding process, the degree to which the substrate expands and contracts is decreased even though heat is applied to the semiconductor package.

Therefore, occurrence of warpage in a semiconductor package is minimized, and as a result, occurrence of cracks in the bonding portions between the solder balls and the ball lands is avoided.

In another embodiment of the present invention, a plurality of via-holes are defined adjacent to the edge portions of a substrate. When forming molding structures on the upper and lower surfaces of the substrate in the same manner as the aforementioned embodiment, epoxy molding compound is filled in the respective via-holes.

Thus, in the present invention, since the molding structures formed on the upper and lower surfaces of the substrate are integrally connected with each other via the epoxy molding compound which fills the via-holes, it is possible to manufacture a semiconductor package which does not warp and advantageously withstands thermal stress.

Figure 5:
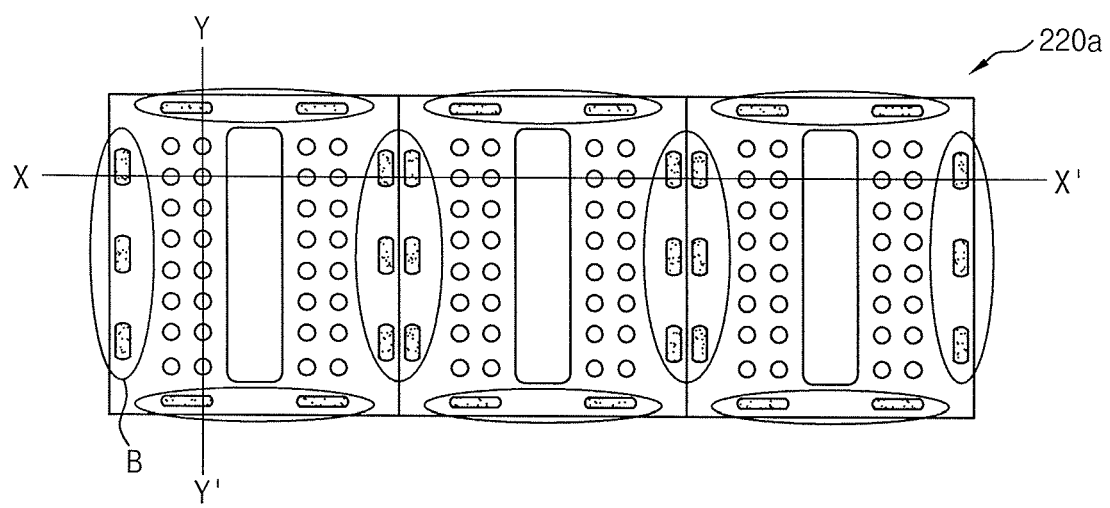
FIG. 5 is a plan view illustrating a substrate which is used for a semiconductor package in accordance with another embodiment of the present invention.

FIG. 5 is a plan view illustrating a substrate that is used for a semiconductor package in accordance with another embodiment of the present invention.

Referring to FIG. 5, a substrate 220a, which is used for a semiconductor package, has via-holes B defined on the left and right sides thereof or the upper, lower, left, and right sides thereof when viewed in a direction of the major axis of the substrate 220a. Each via-hole B has a size that allows epoxy molding compound to sufficiently flow into the via-hole B during the epoxy molding process. The size and the number of the via-holes B are determined by the size of the package and the characteristics of the material used in the molding process.

Figure 6A:
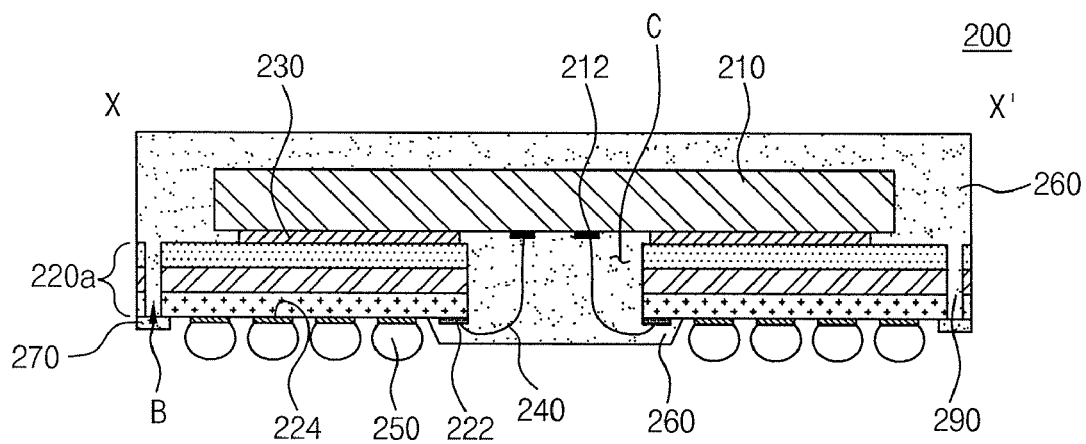
FIGS. 6A and 6B are cross-sectional views illustrating the semiconductor package as shown in FIG. 5 along the lines X-X' and Y-Y' respectively in accordance with another embodiment of the present invention.
Figure 6B:
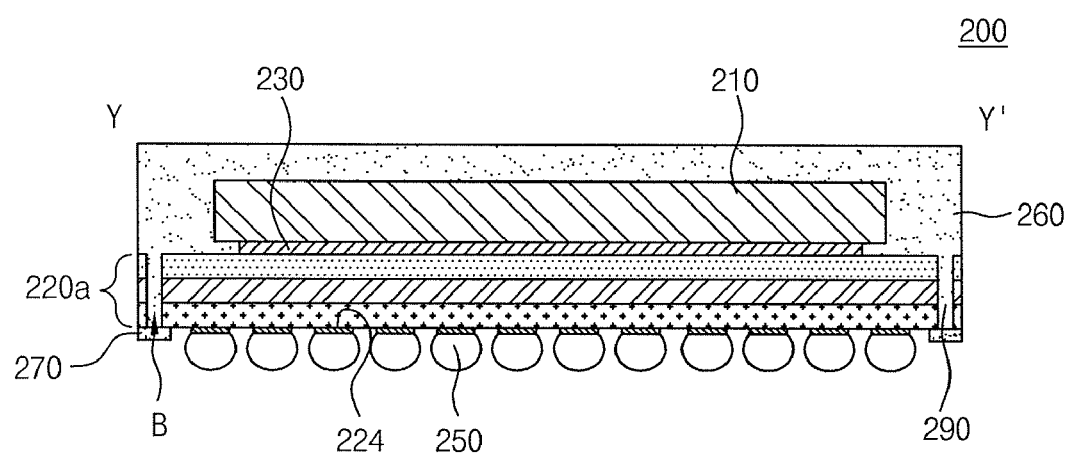

FIGS. 6A and 6B are cross-sectional views illustrating the semiconductor package in accordance with another embodiment of the present invention.

FIG. 6A shows the cross-sectional view along the line X-X' (shown in FIG. 5) of the substrate 220a of the semiconductor package in accordance with another embodiment of the present invention, and FIG. 6B shows the cross-sectional view along the line Y-Y' of the substrate 220a (shown in FIG. 5). The semiconductor package of this embodiment is manufactured using the substrate 220a shown in FIG. 5 in the same manner as the aforementioned embodiment.

A first molding structure 260 and a second molding structure 270 are physically connected to each other by a third molding structure 290, which is formed in the via-holes B defined on the upper and lower sides or the upper, lower, left and right sides of the substrate 220a when viewed in the direction of the major axis of the substrate 220a. The via-holes B and the third molding structure 290 formed therein are located adjacent to two opposite sides or edge portions or all four sides or edge portions to correspond to the second molding structure 270.

The third molding structure 290, which is formed in the via-holes B, is simultaneously injected when the liquid state epoxy molding compound is injected to form the first and second molding structures 260 and 270.

Accordingly, due to the fact that the first molding structure 260 and the second molding structure 270 are integrally connected with each other by the third molding structure 290, which is formed in the via-holes B, it is possible to form a semiconductor package that is firm and resists warpage due to thermal stress.

In FIGS. 6A and 6B, the reference numeral 200 designates a semiconductor package; 210 designates a semiconductor chip; 212 designates bonding pads; 222 designates connection pads; 224 designates ball lands; 230 designates a bonding material; 240 designates bonding wires; 250 designates solder balls; and C designates an opening.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor package comprising:
    a substrate having a plurality of connection pads and a plurality of ball lands;
    a semiconductor chip attached to one surface of the substrate and having a plurality of bonding pads that are connected to the respective connection pads of the substrate;
    a first molding structure covering an upper surface of the substrate including a connection region between the bonding pads and the connection pads and the semiconductor chip;
    a second molding structure formed adjacent to an edge of the lower surface of the substrate; and
    a plurality of solder balls attached to the respective ball lands of the substrate.

2. The semiconductor package as set forth in claim 1, wherein the semiconductor chip is attached to the substrate in a face-down manner.

3. The semiconductor package as set forth in claim 2, wherein the bonding pads are arranged in the middle portion on the surface of the semiconductor chip facing the substrate.

4. The semiconductor package as set forth in claim 3, wherein the substrate has an opening in the middle portion thereof, which exposes the bonding pads of the semiconductor chip.

5. The semiconductor package as set forth in claim 4, wherein the connection pads are positioned around the opening on the other surface of the substrate, and the ball lands are positioned outward from the connection pads on the other surface of the substrate.

6. The semiconductor package as set forth in claim 5, wherein the connection pads of the substrate are electrically connected to the bonding pads of the semiconductor chip by metal wires that extend through the opening.

7. The semiconductor package as set forth in claim 6, wherein the opening of the substrate including the metal wires and a portion around the opening are filled and covered by the first molding structure.

8. The semiconductor package as set forth in claim 1, wherein the second molding structure is formed to extend from portions adjacent to the ball lands, which are positioned outermost on the substrate to the edge of the substrate.

9. The semiconductor package as set forth in claim 1, wherein the second molding structure is formed to have a height that is less than that of the solder ball.

10. A semiconductor package comprising:
    a substrate having a plurality of connection pads and a plurality of ball lands and defined with a plurality of via-holes adjacent to an edge thereof;
    a semiconductor chip attached to one surface of the substrate and having a plurality of bonding pads that are connected to the respective connection pads of the substrate;
    a first molding structure covering an upper surface of the substrate including a connection region between the bonding pads and the connection pads and the semiconductor chip;
    a second molding structure formed adjacent to the edge of the lower surface of the substrate;
    a third molding structure formed in the respective via-holes of the substrate; and
    a plurality solder balls attached to the respective ball lands of the substrate,
    wherein the first and second molding structures are integrally connected to each other by the third molding structure.

11. The semiconductor package as set forth in claim 10, wherein the via-holes are defined adjacent to two opposite edge portions or all four edge portions of the substrate, on which the second molding structure is formed.

12. The semiconductor package as set forth in claim 10, wherein the semiconductor chip is attached to the substrate in a face-down manner.

13. The semiconductor package as set forth in claim 12, wherein the bonding pads are arranged in the middle portion on the surface of the semiconductor chip that faces the substrate.

14. The semiconductor package as set forth in claim 13, wherein the substrate has an opening in the middle portion thereof, which exposes the bonding pads of the semiconductor chip.

15. The semiconductor package as set forth in claim 14, wherein the connection pads are positioned around the opening on the other surface of the substrate, and the ball lands are positioned outward from the connection pads on the other surface of the substrate.

16. The semiconductor package as set forth in claim 15, wherein the connection pads of the substrate are electrically connected to the bonding pads of the semiconductor chip by metal wires which extend through the opening.

17. The semiconductor package as set forth in claim 16, wherein the opening of the substrate including the metal wires and a portion around the opening are filled and covered by the first molding structure.

18. The semiconductor package as set forth in claim 10, wherein the second molding structure is formed to extend from portions adjacent to the ball lands positioned outermost on the substrate to the edge of the substrate.

19. The semiconductor package as set forth in claim 10, wherein the second molding structure is formed to have a height that is less than that of the solder ball.

* * * * *